(12) United States Patent
Komyo et al.

(10) Patent No.: US 7,999,572 B2
(45) Date of Patent: Aug. 16, 2011

(54) SEMICONDUCTOR INTEGRATED CIRCUIT

(75) Inventors: Masayasu Komyo, Kanagawa (JP); Yoichi Iizuka, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 12/876,793

(22) Filed: Sep. 7, 2010

(65) Prior Publication Data
US 2011/0057722 A1 Mar. 10, 2011

(30) Foreign Application Priority Data
Sep. 9, 2009 (JP) ................. 2009-207627

(51) Int. Cl.
*H03K 19/00* (2006.01)
*H03K 19/02* (2006.01)

(52) U.S. Cl. ........... 326/58; 326/30; 326/86; 326/87; 327/109; 327/112; 327/551; 365/193

(58) Field of Classification Search .......... 326/30, 326/56–58, 82–83, 86–87; 327/108–109, 327/112, 551; 365/193
See application file for complete search history.

(56) References Cited

U.S. PATENT DOCUMENTS

| | | |
|---|---|---|
| 5,467,455 A | 11/1995 | Gay et al. |
| 6,380,758 B1 * | 4/2002 | Hsu et al. ............ 326/30 |
| 7,808,269 B2 * | 10/2010 | Matsudera ............ 326/30 |
| 2003/0039151 A1 | 2/2003 | Matsui |
| 2003/0080774 A1 * | 5/2003 | Funaba .............. 326/30 |

OTHER PUBLICATIONS

U.S. Appl. No. 12/876,747, filed Sep. 7, 2010, Komyo et al.
U.S. Appl. No. 12/876,760, filed Sep. 7, 2010, Komyo et al.
JEDEC STANDARD, DDR2 SDRAM Specification, JESD79-2E (Revision of JESD79-2D), JEDEC Solid State Technology Association, Apr. 2008, 125 pages.
Masayasu Komyo et al., USPTO Office Action, U.S. Appl. No. 12/876,747, Feb. 2, 2011, 10 pages.

* cited by examiner

*Primary Examiner* — Jason M Crawford
(74) *Attorney, Agent, or Firm* — Foley & Lardner LLP

(57) ABSTRACT

Provided is a semiconductor integrated circuit according to an exemplary aspect of the present invention including a data transmitting circuit that transmits data in parallel through a plurality of signal lines and a data receiving circuit that receives the data. The data transmitting circuit includes a plurality of data output circuits that output the data in a data transmission mode or set an output to a high impedance state in a HiZ mode, a plurality of data selection circuits that select one of the data and fixed data and output the selected data to the data output circuits, and a control circuit that controls the data output circuits to output the fixed data during a period between a time when a mode is switched from the HiZ mode to the data transmission mode and a time when the data output circuits start to output the data.

6 Claims, 4 Drawing Sheets

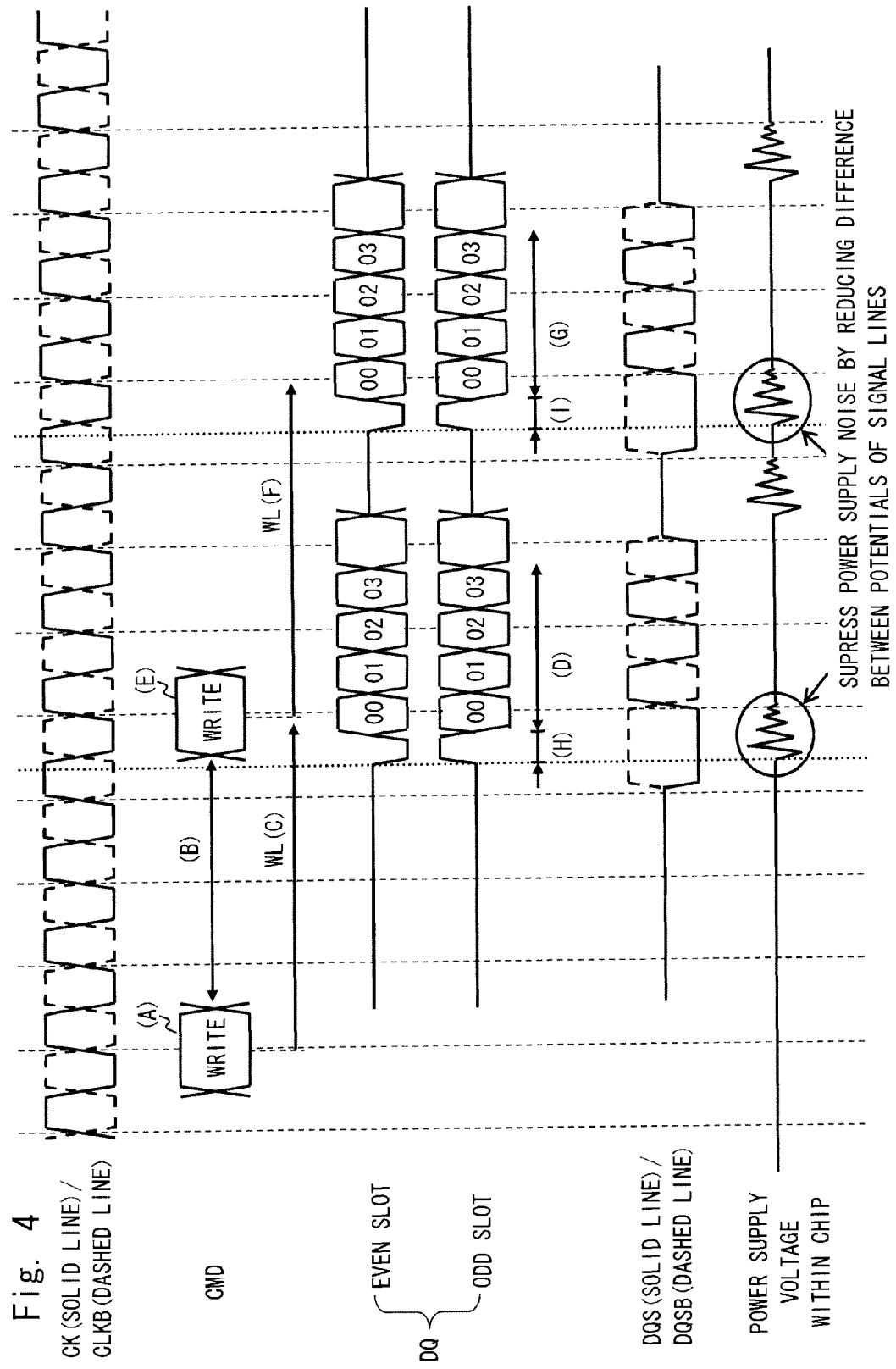

SEMICONDUCTOR INTEGRATED CIRCUIT

INCORPORATION BY REFERENCE

This application is based upon and claims the benefit of priority from Japanese patent application No. 2009-207627, filed on Sep. 9, 2009, the disclosure of which is incorporated herein in its entirety by reference.

BACKGROUND

1. Field of the Invention

The present invention relates to a semiconductor integrated circuit, and more particularly, to a semiconductor integrated circuit suitable for power-supply noise reduction.

2. Description of Related Art

In a semiconductor integrated circuit, there has been a problem that data transmission between a data transmitting circuit and a data receiving circuit is not accurately executed when power-supply noise occurs on a plurality of signal lines used for the data transmission between these circuits.

Therefore, a countermeasure, for example, ODT (On Die Termination) technique has been provided to reduce the power-supply noise on signal lines used for data reception of the data receiving circuit (JEDEC STANDARD, DDR2 SDRAM SPECIFICATION JESD79-2E (Revision of JESD79-2D), April 2008, JEDEC SOLID STATE TECHNOLOGY ASSOCIATION).

SUMMARY

In the related art, the countermeasure such as an ODT function has been provided to reduce the power-supply noise which influences the data receiving circuit. However, the related art provides no countermeasure to reduce the power-supply noise which influences the data transmitting circuit. Normally, the data transmitting circuit includes a data output circuit such as a three-state buffer for transmitting data. The data transmitting circuit controls the data output circuit to output or not to output the data based on a control signal.

In other words, in the data output circuit, a data transmission mode in which the data output circuit outputs the data and a high impedance mode (HiZ mode) in which the output of the data output circuit is set to a high impedance state (HiZ) are switched based on the control signal. The data transmitting circuit controls the data output circuit to be in the data transmission mode when transmitting the data and to be in the HiZ mode when not transmitting the data.

The data output circuit outputs last data output by the data output circuit in a last data transmission mode during the period between the time when the mode is switched from the HiZ mode to the data transmission mode and the time when the data output circuit starts to output next data. In this case, the data output circuits provided to the signal lines may output the biased data whose voltage level is H or L level.

More particularly, in the case where the IO areas (for example, IO buffers) corresponding to the signal lines are arranged adjacent to each other, the power-supply noise occurring on each signal line is amplified when the data output circuits start to output the data having the same potential at the same time from the HiZ mode. Therefore, the present inventors have found a problem in the related art that, as described above, it is impossible for the data transmitting circuit to transmit the data accurately.

An exemplary aspect of the present invention is a semiconductor integrated circuit including:

a data transmitting circuit that transmits transmission data in parallel through a plurality of signal lines; and
a data receiving circuit that receives the transmission data, in which
the data transmitting circuit includes:
a plurality of data output circuits that output the transmission data in a data transmission mode or set an output to a high impedance state in a high impedance mode, the data output circuits being provided to the corresponding signal lines;
a plurality of data selection circuits that select one of the transmission data and fixed data preliminarily set and outputs the selected data to the corresponding data output circuits; and
a control circuit that controls the data output circuits to output the fixed data during a period between a time when a mode is switched from the high impedance mode to the data transmission mode and a time when the data output circuits start to output the transmission data.

With the circuit structure as described above, it is possible to transmit data accurately by reducing the amplification of the power-supply noise.

According to an exemplary aspect of the present invention, it is possible to provide a semiconductor integrated circuit capable of transmitting data accurately.

BRIEF DESCRIPTION OF THE DRAWINGS

The above and other exemplary aspects, advantages and features will be more apparent from the following description of certain exemplary embodiments taken in conjunction with the accompanying drawings, in which:

FIG. 4 is a timing chart depicting an operation of the semiconductor integrated circuit according to the first exemplary embodiment of the present invention.

DETAILED DESCRIPTION OF THE EXEMPLARY EMBODIMENTS

Figure 1:
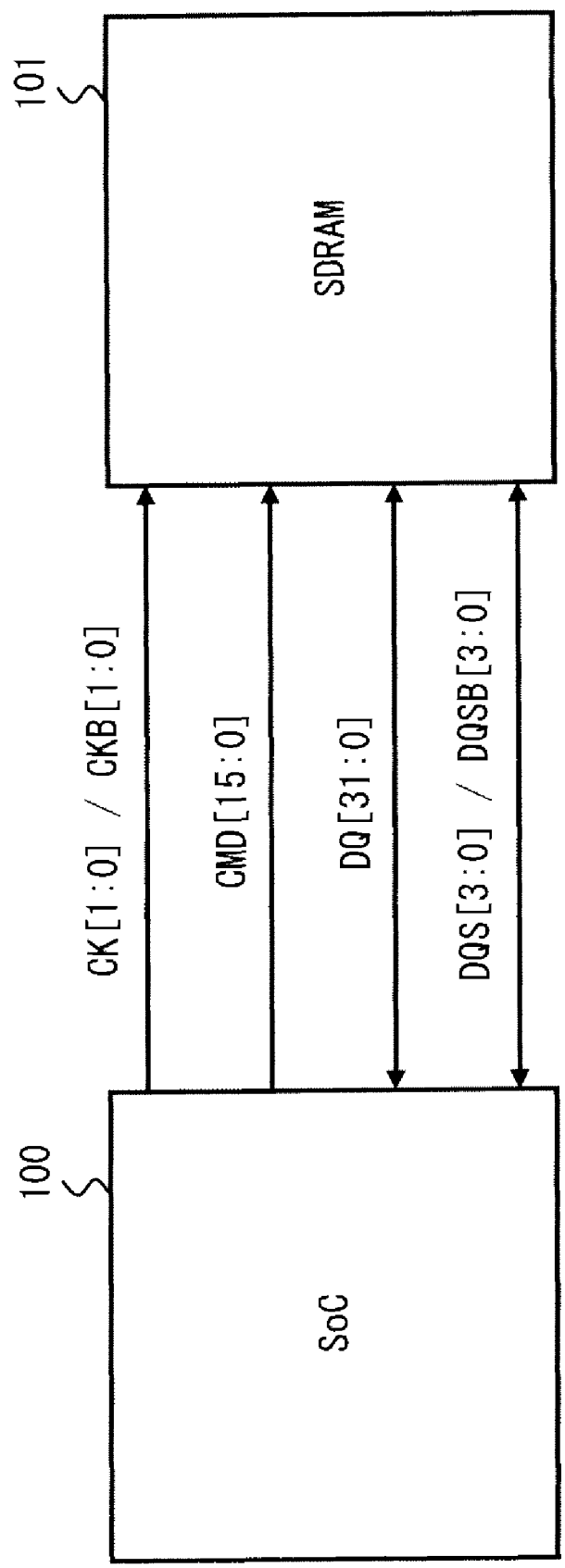
FIG. 1 illustrates a semiconductor integrated circuit according to a first exemplary embodiment of the present invention.

Specific exemplary embodiments of the present invention are described in detail below with reference to the drawings. The same components are denoted by the same reference numerals in the drawings, and for clarity of explanation, repeated explanation is omitted as appropriate.

First Exemplary Embodiment

Referring to the drawings, a semiconductor integrated circuit according to a first exemplary embodiment of the present invention will be described. The present invention can be applied to a circuit which includes a data transmitting circuit that transmits data in parallel through a plurality of signal lines and a data receiving circuit that receives the data transmitted from the data transmitting circuit, and which controls the output of the data transmitting circuit based on a control signal. In this exemplary embodiment, a case is explained hereinafter in which the circuit shown in FIG. 1 includes an SoC (System on Chip) circuit and an SDRAM (Synchronous Dynamic Random Access Memory) circuit, and data transmission is executed between the SoC circuit and the SDRAM circuit through signal lines for bidirectionally transmitting data between these circuits (hereinafter, referred to simply as "bidirectional signal lines").

FIG. 1 illustrates a semiconductor integrated circuit according to the first exemplary embodiment of the present invention. The circuit shown in FIG. 1 includes an SoC circuit (data transmitting circuit) 100 and an SDRAM circuit (data receiving circuit) 101. Data transmission is executed between the SoC circuit 100 and the SDRAM circuit 101 in the DDR (double data rate) mode.

First, the circuit structure of the semiconductor integrated circuit according to the first exemplary embodiment of the present invention will be described. The SoC circuit 100 outputs a 2-bit clock signal CK and a 2-bit clock signal CKB, which is a differential signal of the clock signal CK, to the SDRAM circuit 101. The SoC circuit 100 further outputs a 16-bit control signal CMD, which includes commands for each address of the SDRAM circuit 101, to the SDRAM circuit 101. Note that the SDRAM circuit 101 receives the control signal CMD in synchronization with the clock signals CK and CKB.

Each of 32-bit data DQ, a 4-bit strobe signal DQS, and a 4-bit strobe signal DQSB, which is a differential signal of the strobe signal DQS, is bidirectionally transmitted and received between the SoC circuit 100 and the SDRAM circuit 101. A receiving circuit, which is one of the SoC circuit 100 and the SDRAM circuit 101, receives the data DQ in synchronization with the strobe signals DQS and DQSB. Note that the signal names described above also represent the corresponding signal line names.

Figure 2:
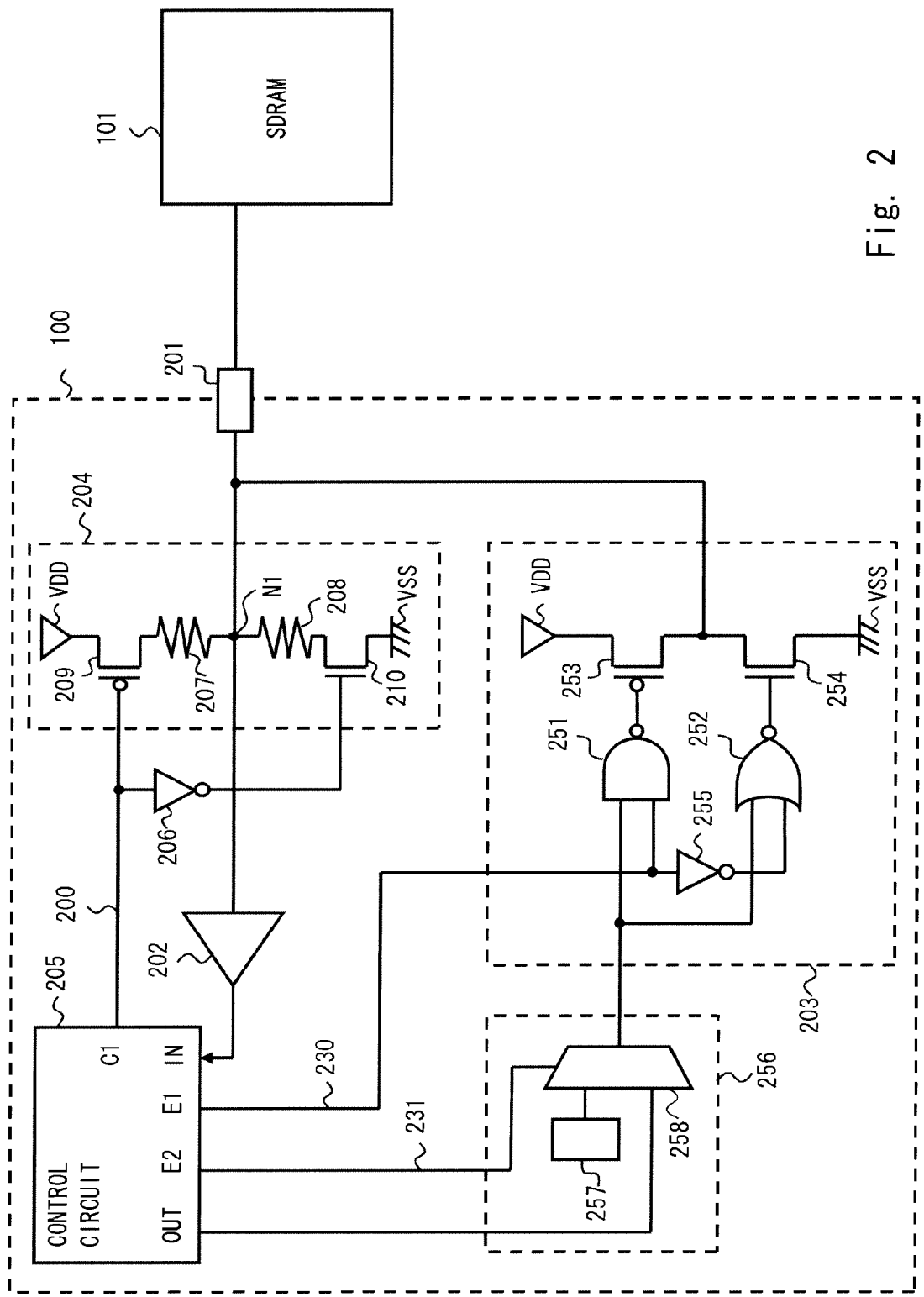
FIG. 2 illustrates the semiconductor integrated circuit according to the first exemplary embodiment of the present invention.

The circuit shown in FIG. 2 shows a 1-bit bidirectional signal line, which is one of strobe signal lines DQS[3:0] and DQSB[3:0] and a data signal line DQ[31:0], and corresponding peripheral circuits of the circuit shown in FIG. 1. In this exemplary embodiment, a case is explained hereinafter in which the 1-bit bidirectional signal line is the data signal line DQ[0]. The data signal line DQ[0] is connected between the SoC circuit 100 and the SDRAM 101 as described above.

The SoC circuit 100 includes an external terminal 201, a buffer 202, a data output circuit 203, a data selection circuit 256, a termination circuit 204 which has an ODT function, a control circuit 205, and an inverter 206. The termination circuit 204 includes resistors 207 and 208 and switches 209 and 210.

The data output circuit 203 includes a NAND circuit 251, a NOR circuit 252, and transistors 253 and 254. In this exemplary embodiment, a case is explained hereinafter in which the switch 209 and the transistor 253 are P-channel MOS transistors and the switch 210 and the transistor 254 are N-channel MOS transistors. The data selection circuit 256 includes a register 257 which stores fixed data and a selector 258.

In the SoC circuit 100, the data signal line DQ[0] is connected to an input terminal of the buffer 202 and an output terminal of the data output circuit 203 through the external terminal 201.

The termination circuit 204 is provided between the external terminal 201 and the buffer 202. In the termination circuit 204, the switch 209 and the resistor 207 are connected in series between a high potential side power supply terminal VDD and a node N1 which is located on the signal line connecting the external terminal 201 and the buffer 202. The switch 210 and the resistor 208 are connected in series between a low potential side power supply terminal VSS and the node N1. In other words, the source terminal of the switch 209 is connected to the high potential side power supply terminal VDD. The drain terminal of the switch 209 is connected to one terminal of the resistor 207. The other terminal of the resistor 207 is connected to one terminal of the resistor 208. The other terminal of the resistor 208 is connected to the drain terminal of the switch 210. The source terminal of the switch 210 is connected to the low potential side power supply terminal VSS. The other terminal of the resistor 207 and one terminal of the resistor 208 are commonly connected to the node N1. Note that the switch 209 and the resistor 207 which are connected in series between the high potential side power supply terminal VDD and the node N1 may be switched around. Similarly, the switch 210 and the resistor 208 which are connected in series between the low potential side power supply terminal VSS and the node N1 may be switched around.

An output terminal of the buffer 202 is connected to an input terminal IN used for inputting data of the control circuit 205. An output terminal C1 of the control circuit 205 is connected to the gate terminal of the switch 209 and the gate terminal of the switch 210 through the inverter 206. Such a peripheral circuit configuration is also employed in the other bidirectional signal lines. Note that the control circuit 205 is commonly provided to these bidirectional signal lines.

An output terminal OUT used for outputting data of the control circuit 205 is connected to one input terminal of the selector 258 included in the data selection circuit 256. An output terminal of the resistor 257 is connected to the other input terminal of the selector 258. An output terminal E2 for outputting a control signal (first control signal) 231 of the control circuit 205 is connected to a switching control terminal of the selector 258. An output terminal of the selector 258 is connected to one input terminal of the NAND circuit 251 and one input terminal of the NOR circuit 252 in the data output circuit 203.

An output terminal E1 for outputting a control signal (second control signal) 230 of the control circuit 205 is connected to the other input terminal of the NAND circuit 251 and the other input terminal of the NOR circuit 252 through the inverter 255 in the data output circuit 203. An output terminal of the NAND circuit 251 is connected to the gate terminal of the transistor 253. An output terminal of the NOR circuit 252 is connected to the gate terminal of the transistor 254. The transistors 253 and 254 are connected in series between the high potential side power supply terminal VDD and the low potential side power supply terminal VSS. In other words, the transistors 253 and 254 constitute an inverter. The drain terminal of the transistor 253 and the drain terminal of the transistor 254 are commonly connected to a node which is located on the signal line connecting between the buffer 202 and the external terminal 201. Such a peripheral circuit configuration is also employed in the other bidirectional signal lines.

Next, the operation of the semiconductor integrated circuit according to the first exemplary embodiment of the present invention will be described. A case is explained hereinafter in which the SoC circuit 100 receives (reads) the data such as the data DQ transmitted from the SDRAM circuit 101. First, the SoC circuit 100 outputs the control signal CMD to the SDRAM circuit 101. After that, for example, the SDRAM circuit 101 transmits the data DQ stored in a memory area of an address specified by the control signal CMD, and the strobe signals DQS and DQSB to the SoC circuit 100. In this case, the data DQ transmitted from the SDRAM circuit 101 has a predetermined burst length.

The SoC circuit 100 receives each signal output from the SDRAM circuit 101 through the corresponding signal line, external terminal 201, and buffer 202. Note that the SoC circuit 100 receives the data DQ in synchronization with the strobe signals DQS and DQSB. The data DQ received by the SoC circuit 100 is input to the control circuit 205 and the other peripheral circuits (not shown). A period between the time when the SoC circuit 100 starts to transmit the control signal CMD and the time when the SoC circuit 100 starts to receive the corresponding data DQ is called a read latency (RL).

When receiving the data transmitted from the SDRAM circuit 101, the SoC circuit 100 controls the ODT function of the corresponding termination circuit 204 to be turned on to reduce power-supply noise occurring on the data signal line DQ and the strobe signal lines DQS and DQSB. Specifically, the SoC circuit 100 controls the switches 209 and 210, which are provided in the corresponding termination circuit 204, to be turned on based on a control signal 200 from the control circuit 205 and sets the node on the corresponding signal line to a predetermined potential (for example, one-half of the high potential side power supply voltage VDD). This makes it possible for the SoC circuit 100 to receive the data accurately by reducing the power-supply noise included in the received data.

Moreover, the SoC circuit 100 controls the data output circuit 203 not to output the data to the SDRAM circuit 101 based on the control signal 230 from the control circuit 205. In other words, the SoC circuit 100 controls the output of the data output circuit 203 to be set to a high impedance state (HiZ) based on the control signal 230 of L level. The output of the data output circuit 203 indicates HiZ because the transistors 253 and 254 are both controlled to be turned off when the control signal 230 is L level. This makes it possible for the SoC circuit 100 to accurately receive the data transmitted from the SDRAM circuit 101 without being influenced by the other data output from the data output circuit 203.

A case is explained hereinafter in which the SoC circuit 100 transmits (writes) the data to the SDRAM circuit 101. First, the SoC circuit 100 outputs the control signal CMD to the SDRAM circuit 101. After that, the SoC circuit 100 transmits the data DQ and the strobe signals DQS and DQSB to the SDRAM circuit 101. In this case, the data DQ transmitted from the SoC circuit 100 has a predetermined burst length.

Then, the SDRAM circuit 101 receives the data DQ in synchronization with the strobe signals DQS and DQSB. For example, the data DQ is written into the memory area of the address specified by the control signal CMD. A period between the time when the SoC circuit 100 starts to transmit the control signal CMD and the time when the SoC circuit 100 starts to transmit the corresponding data DQ is called a write latency (WL).

When transmitting the data to the SDRAM circuit 101, the SoC circuit 100 controls the ODT function of the corresponding termination circuit 204 to be turned off. Specifically, the SoC circuit 100 controls the switches 209 and 210, which are provided in the corresponding termination circuit 204, to be turned off based on the control signal 200 from the control circuit 205, thereby preventing the potential of the data transmitted to the SDRAM circuit 101 through the data output circuit 203 and the external terminal 201 from being decayed. This makes it possible for the SoC circuit 100 to transmit the data to the SDRAM circuit 101 accurately.

Then, the SoC circuit 100 controls the data output circuit 203 to output the data to the SDRAM circuit 101 based on the control signal 230 from the control circuit 205. In other words, the SoC circuit 100 controls the data output circuit 203 to output the data to the SDRAM circuit 101 based on the control signal 230 of H level.

When the control signal 230 is H level, the transistors 253 and 254 are controlled to be turned on and off in accordance with the data output from the control circuit 205. Thereby, the SoC circuit 100 transmits the data to the SDRAM circuit 101. Note that in the data selection circuit 256, the selector 258 selects one of the data generated by the control circuit 205 and the fixed data stored in the resistor 257 based on the control signal 231 and outputs the selected data to the data output circuit 203. In other words, the data selection circuit 256 selects the data generated by the control circuit 205 and outputs the selected data when the SoC circuit 100 transmits the data.

In this manner, the SoC circuit 100 switches between a read mode in which the SoC circuit 100 receives the data transmitted from the SDRAM circuit 101 and a write mode in which the SoC circuit 100 transmits the data to the SDRAM circuit 101, based on the control signal CMD. Note that the SoC circuit 100 outputs the control signal CMD which has a data length corresponding to one cycle of the clock signal CK at predetermined time intervals.

Moreover, the SoC circuit 100 controls the data output circuit 203 to output or not to output the data based on the control signal 230. In other words, in the data output circuit 203, a data transmission mode in which the data output circuit 203 outputs the data and a high impedance mode (HiZ mode) in which the output of the data output circuit 203 is set to a high impedance state (HiZ) are switched based on the control signal 230. The SoC circuit 100 controls the data output circuit 203 to be in the data transmission mode when transmitting the data and to be in the HiZ mode when not transmitting the data.

For example, the SoC circuit 100 receives data such as the data DQ in the read mode or transmits the data in the write mode, and after the predetermined time interval, receives or transmits another data in the same mode. Alternatively, the SoC circuit 100 receives data such as the data DQ in the read mode or transmits the data in the write mode, and after the predetermined time interval, receives or transmits another data in a different mode. The data transmission and reception as described above is repeated.

The SoC circuit 100 according to this exemplary embodiment exhibits characteristics when the SoC circuit 100 transmits data such as the data DQ. The operation of the SoC circuit 100 in this case will be described with reference to FIG. 3 and FIG. 4.

Figure 3:
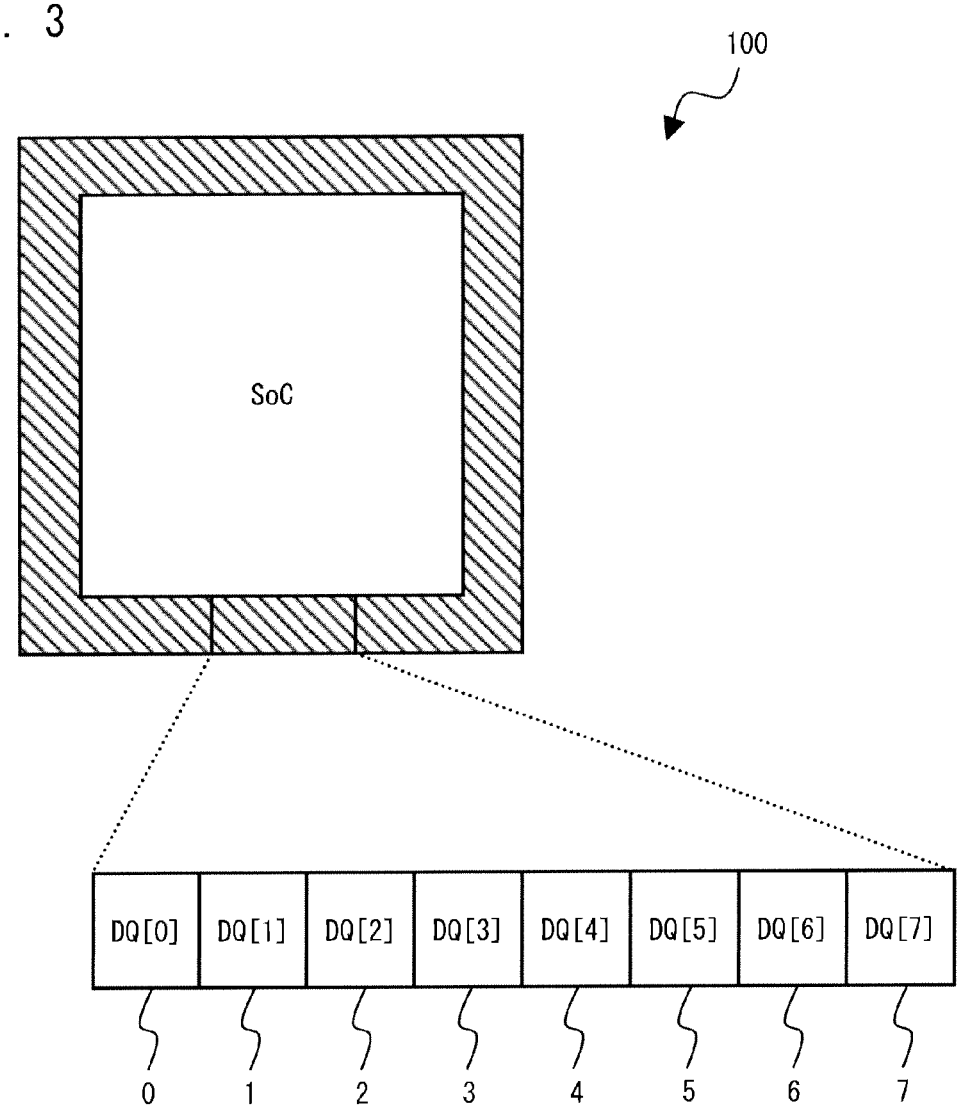
FIG. 3 illustrates a layout of the semiconductor integrated circuit according to the first exemplary embodiment of the present invention.

FIG. 3 illustrates a layout of IO areas included in the SoC circuit 100. As shown in FIG. 3, the IO areas are arranged in a ring shape along the enclosure of the SoC circuit 100. Note that the IO areas in the SoC circuit 100 are the areas for interfacing external circuits such as the SDRAM circuit 101. Each of the IO areas includes an IO buffer, IOPAD, and an external terminal.

In this exemplary embodiment as shown in FIG. 3, a case is explained hereinafter in which the IO areas corresponding to the bit lines of the data DQ are arranged adjacent to each other in the lateral direction in the plane of FIG. 3 along the enclosure of the SoC circuit 100. For convenience, the IO areas arranged from left to right in the plane of FIG. 3 are referred to as slot 0 to slot 7. The slot 0 corresponds to the data DQ[0]. The slot 1 corresponds to the data DQ[1]. The slot 2 corresponds to the data DQ[2]. The slot 3 corresponds to the data DQ[3]. The slot 4 corresponds to the data DQ[4]. The slot 5 corresponds to the data DQ[5]. The slot 6 corresponds to the data DQ[6]. The slot 7 corresponds to the data DQ[7].

FIG. 4 is a timing chart in the case where the write mode is repeated. First, the SoC circuit 100 outputs the control signal CMD (which is indicated by "A" shown in FIG. 4 and is hereinafter referred to as "write command A") to the SDRAM circuit 101. Then, the SoC circuit 100 transmits the data DQ ("D" shown in FIG. 4), which has a predetermined burst length, and the corresponding strobe signals DQS and DQSB to the SDRAM circuit 101 after the period of the write latency WL ("C" shown in FIG. 4).

In this case, when transmitting the data, the SoC circuit 100 controls the corresponding data output circuit 203 to output the data.

After outputting the write command A, the SoC circuit 100 outputs a write command E ("E" shown in FIG. 4) after the lapse of a predetermined time interval ("B" shown in FIG. 4). Then, the SoC circuit 100 transmits the data DQ ("G" shown in FIG. 4), which has a predetermined burst length, and the corresponding strobe signals DQS and DQSB to the SDRAM circuit 101 after the period of the write latency WL ("F" shown in FIG. 4).

Each of the data output circuits 203 outputs the fixed data stored in the corresponding resistor 257 during the period ("H" and "I" shown in FIG. 4) between the time when the mode is switched from the HiZ mode to the data transmission mode and the time when the data output circuit 203 starts to output the data from the control circuit 205. In other words, each of the data selection circuits 256 outputs the fixed data to the corresponding data output circuit 203 based on the control signal 231 output from the control circuit 205.

In this case, the data output circuits 203 corresponding to the even slots 0, 2, 4, and 6 output the fixed data of L level. The data output circuits 203 corresponding to the odd slots 1, 3, 5, and 7 output the fixed data of H level. The fixed data of the adjacent slots (for example, the slot 0 and the slot 1) have different potentials from each other because the slots 0 to 7 are arranged adjacent to each other in the lateral direction in the plane of FIG. 3.

In summary, the data output circuits 203 output the fixed data during the period ("H" and "I" shown in FIG. 4) between the time when the mode is switched from the HiZ mode to the data transmission mode and the time when the data output circuit 203 starts to output the data from the control circuit 205, so that the potentials on the signal lines corresponding to the adjacent IO areas are prevented from being biased. Therefore, it is possible to reduce the amplification of the power-supply noise occurring on the signal lines of the IO areas. This makes it possible for the SoC circuit 100 to transmit the data accurately.

As described above, in the semiconductor integrated circuit according to this exemplary embodiment, in the case where the data transmitting circuit transmits data in parallel through a plurality of the signal lines, the data output circuits 203 output fixed data preliminarily set during the period between the time when the mode is switched from the HiZ mode to the data transmission mode and the time when the data output circuit 203 starts to output the data from the control circuit 205. This makes it possible for the semiconductor integrated circuit according to this exemplary embodiment to transmit the data accurately by reducing the amplification of the power-supply noise.

Note that the present invention is not limited to the above exemplary embodiments, but can be modified as appropriate within the scope of the present invention. For example, though the above-mentioned exemplary embodiments have described an example in which the SoC circuit 100 transmits the data to the SDRAM circuit 101, the present invention is not limited thereto. The present invention is also applicable to a circuit configuration in which the SDRAM circuit 101 transmits the data to the SoC circuit 100.

Though the above-mentioned exemplary embodiments have described the case where the signal line which is used for the output of the data output circuit 203 is a bidirectional signal line, the present invention is not limited thereto. The present invention is also applicable to a circuit configuration in which the signal line which is used for the output of the data output circuit 203 is a signal line dedicated for transmitting data.

The termination circuit is not limited to the circuit illustrated in the above-mentioned exemplary embodiments. The present invention is also applicable to a circuit configuration including a resistor and a switch which are connected in series between the power supply terminal having the predetermined potential (for example, one-half of the high potential side power supply voltage VDD) and the node on the corresponding signal line. Moreover, though the above-mentioned exemplary embodiments have described the case where the termination circuit is included, the present invention is not limited thereto. The present invention is also applicable to a circuit configuration in which the termination circuit is not included.

Though the above-mentioned exemplary embodiments have described an example in which the semiconductor integrated circuit includes a single SDRAM circuit, the present invention is not limited thereto. The present invention is also applicable to a circuit configuration including a plurality of SDRAM circuits.

Though the above-mentioned exemplary embodiments have described an example in which the IO areas corresponding to the bit lines of the data DQ are arranged as shown in FIG. 3, the present invention is not limited thereto. The present invention is also applicable to the case where the IO areas are arranged at a distance where the power-supply noise of the corresponding signal lines affects each other. In this case, setting should be made so that the signal lines of the IO areas which are arranged adjacent to each other are prevented from being locally supplied with the fixed data having the same potential.

While the invention has been described in terms of several exemplary embodiments, those skilled in the art will recognize that the invention can be practiced with various modifications within the spirit and scope of the appended claims and the invention is not limited to the examples described above.

Further, the scope of the claims is not limited by the exemplary embodiments described above.

Furthermore, it is noted that, Applicant's intent is to encompass equivalents of all claim elements, even if amended later during prosecution.

What is claimed is:

1. A semiconductor integrated circuit comprising:
   a data transmitting circuit that transmits transmission data in parallel through a plurality of signal lines; and
   a data receiving circuit that receives the transmission data, wherein
   the data transmitting circuit comprises:
      a plurality of data output circuits that output the transmission data in a data transmission mode or set an output to a high impedance state in a high impedance mode, the data output circuits being provided to the corresponding signal lines;
      a plurality of data selection circuits that select one of the transmission data and fixed data preliminarily set and output the selected data to the corresponding data output circuits; and
      a control circuit that controls the data output circuits to output the fixed data during a period between a time when a mode is switched from the high impedance mode to the data transmission mode and a time when the data output circuits start to output the transmission data.

2. The semiconductor integrated circuit according to claim 1, wherein
each of the data selection circuits comprises:
a resistor that outputs the fixed data; and
a selector that selects one of the fixed data and the transmission data based on a first control signal output from the control circuit and outputs the selected data.

3. The semiconductor integrated circuit according to claim 1, wherein each of the data output circuits switches between the data transmission mode and the high impedance mode based on a second control signal output from the control circuit in the data output circuit.

4. The semiconductor integrated circuit according to claim 1, wherein each of the data output circuits switches to the data transmission mode when the data transmitting circuit transmits the transmission data, and switches to the high impedance mode when the data transmitting circuit does not transmit the transmission data.

5. The semiconductor integrated circuit according to claim 1, wherein the fixed data supplied to external terminals arranged adjacent to each other among external terminals provided to the corresponding signal lines of the data transmitting circuit have different potentials.

6. The semiconductor integrated circuit according to claim 1, wherein
each of the data output circuits comprises an inverter that includes a P-channel MOS transistor and an N-channel MOS transistor, and
the P-channel MOS transistor and the N-channel MOS transistor are turned off in the high impedance mode and one of the P-channel MOS transistor and the N-channel MOS transistor is turned on and the other is turned off based on one of the transmission data and the fixed data in the data transmission mode.

* * * * *